(12) United States Patent
Schuurmans

(10) Patent No.: US 8,149,061 B2
(45) Date of Patent: Apr. 3, 2012

(54) CLASS H AMPLIFIER

(75) Inventor: Han Martijn Schuurmans, Wijchen (NL)

(73) Assignee: NXP B.V., Eindhoven (NL)

( * ) Notice: Subject to any disclaimer, the term of this patent is extended or adjusted under 35 U.S.C. 154(b) by 102 days.

(21) Appl. No.: 12/829,532

(22) Filed: Jul. 2, 2010

(65) Prior Publication Data

US 2011/0007909 A1 Jan. 13, 2011

(30) Foreign Application Priority Data

Jul. 6, 2009 (EP) .................................... 09164631

(51) Int. Cl.
*H03F 3/04* (2006.01)
(52) U.S. Cl. .......................................... 330/297; 330/10
(58) Field of Classification Search .......... 330/296–297, 330/10, 291, 207 A; 381/120
See application file for complete search history.

(56) References Cited

U.S. PATENT DOCUMENTS

| 5,777,519 | A | 7/1998 | Simopoulos |
| 5,990,751 | A | 11/1999 | Takita |
| 7,741,914 | B1 * | 6/2010 | Nabicht ................ 330/297 |
| 2002/0030543 | A1 | 3/2002 | French et al. |
| 2009/0160555 | A1 | 6/2009 | Sun |
| 2011/0267142 | A1 * | 11/2011 | Wismar ................. 330/129 |

FOREIGN PATENT DOCUMENTS

EP 2 028 760 A1 2/2009

OTHER PUBLICATIONS

European Search Report for European patent appln. No. 09164631.5 (Nov. 17, 2009).

* cited by examiner

Primary Examiner — Hieu Nguyen

(57) ABSTRACT

A class H amplifier circuit includes a Buck converter 20 and a charge pump 30 which are used to generate voltages which are used in turn to power an output driver 10. A feedback path 36 controls the loop. The circuit is particularly suitable as a high efficiency circuit for driving headphones or loudspeakers.

13 Claims, 4 Drawing Sheets

CLASS H AMPLIFIER

The invention relates to a class H amplifier, in a design that is particularly suitable for driving headphones as well as other applications.

Headphones are typically driven by a class AB amplifier, of conventional design. A typical output power that is required is 0.3 mW per channel. Assuming a 16Ω load, the supply current at the class AB amplifier stage can be calculated.

The root-mean-square (RMS) current Ioeff in terms of the load resistance R1 and output power Po is given by;

$$Ioeff = \sqrt{\frac{Po}{Rl}} = \sqrt{\frac{0.3 \text{ mW}}{16\Omega}} = 4.33 \text{ mA}.$$

The amplitude of the current is;

$$Io = Ioeff \cdot \sqrt{2} = 6.12 \text{ mA}$$

In this case, the average current Ivddave used to supply the class AB amplifier is:

$$Ivddave = \frac{Io}{2\pi}\int_0^\Pi \sin(\theta)d\theta = \frac{Io}{\pi} = 1.95 \text{ mA}$$

For a Class AB output running on 3.3V this results in an input power Pi given by;

$$Pi = Ivddave \cdot Vdd = 1.95 \text{ mA} \cdot 3.3V = 6.35 \text{ mW}$$

Thus, for 0.3 mW output power a power of 6.35 mW is required from the supply. This is not very efficient.

One way of increasing this efficiency is to note that the signal swing for at the output to deliver 0.3 mW into 16Ω is only 98 mV. For this reason, at least in theory, the supply voltage could be lowered to 196 mV, corresponding to a supply power of 0.382 mW. This represents the maximum efficiency possible, and represents an efficiency of $\eta_{max} = 78.5\%$.

Other amplifier classes are known. In a class G configuration, an output class AB stage is driven by a plurality of discrete voltages. In a class H configuration, the output stage is driven by a continuously variable voltage, at least for some of each cycle.

Prior art solutions for high efficiency amplifiers, especially to drive loudspeakers, generally use separately controlled DC-DC converters and Charge Pumps. These often make use of "discontinuous modes", to reduce switching loss at low loads, which can cause considerable interference, due to the fact that switching frequencies become load dependant.

Further, there is a general desire for a low output impedance from amplifiers. There is thus a need for a high efficiency circuit for driving headphones, loudspeakers and other loads.

According to the invention there is provided an amplifier according to claim 1.

The amplifier of the invention is autonomous, and requires no intervention from a host processor for controlling the voltage rail generating circuit, i.e. the Class H supply.

The output of the driver may be used to control the Class H supply so any signal source can be connected to the circuit input. Suitable signal sources include a digital source via a DAC and an analog source coming from an external input, separately or summed together.

To reduce the effect of switching loss, the Buck converter may include a plurality of switches of different size, so that suitably sized switches can be used. By using small switches to drive small currents, and only using the large switches when large currents are required, switching losses can be reduced.

The feedback loop may be frequency limited, to a frequency in the range 100 Hz to 2 KHz, preferably 500 Hz to 2 kHz. Higher frequencies are possible, but will not result in high efficiency.

The processor may be arranged to rectify the signal on the circuit input and to generate an output signal having a voltage difference to the rectified signal, the voltage difference being substantially constant over a cycle of an input signal. This may allow sufficient headroom for the output driver.

For a better understanding of the invention, an embodiment will be described with reference to the accompanying drawings, in which.

Like or similar components are given the same reference numbers in the different figures, which are schematic.

Figure 1:
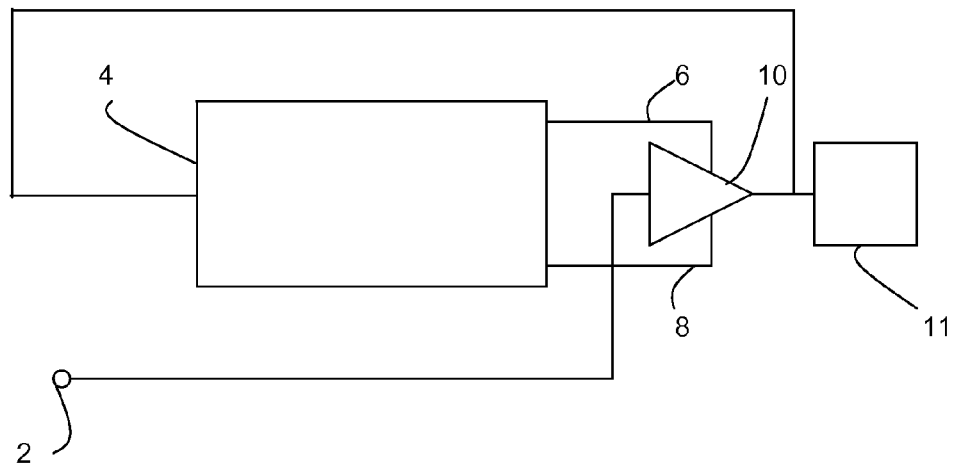
FIG. 1 shows a schematic circuit diagram of the use of a class H amplifier to drive a headphone.

Referring to FIG. 1, headphones 8 are driven by an input signal provided on circuit input 2. The output of the driver 10 drives a voltage rail generation circuit 4 which drives a positive voltage rail 6 and a negative voltage rail 8. These are used as the voltage rails of driver 10 which also accepts as input the signal on input 2. The output of the driver 10 drives headphones 11.

Note that FIG. 1 only shows a single headphone driver 10, i.e. a driver for a mono signal. In practice, a pair of headphone drivers 10 may be provided, one for a left headphone signal and one for a right headphone signal. Separate voltage generation circuits 4 may be provided for each headphone driver 10.

A point of detail in the circuit shown is that the input to the voltage rail generation circuit 4 is taken from the output of the driver 10, not the input 2. In principle, one is the amplified version of the other. There are however benefits in taking the input from the output of driver 10. Firstly, in general the exact properties of the signal on input node 2 are not known—there are applications where this signal may be digital or a current signal, not a voltage. Secondly, the signal on input node 2 may in some applications be the sum of two signals generated by an adder. Thirdly, this allows additional circuitry to be incorporated at input node. In particular, input node 2 may in some applications be a digital signal which cannot be used directly as an analog signal to drive voltage rail generation circuit 4.

Figure 2:
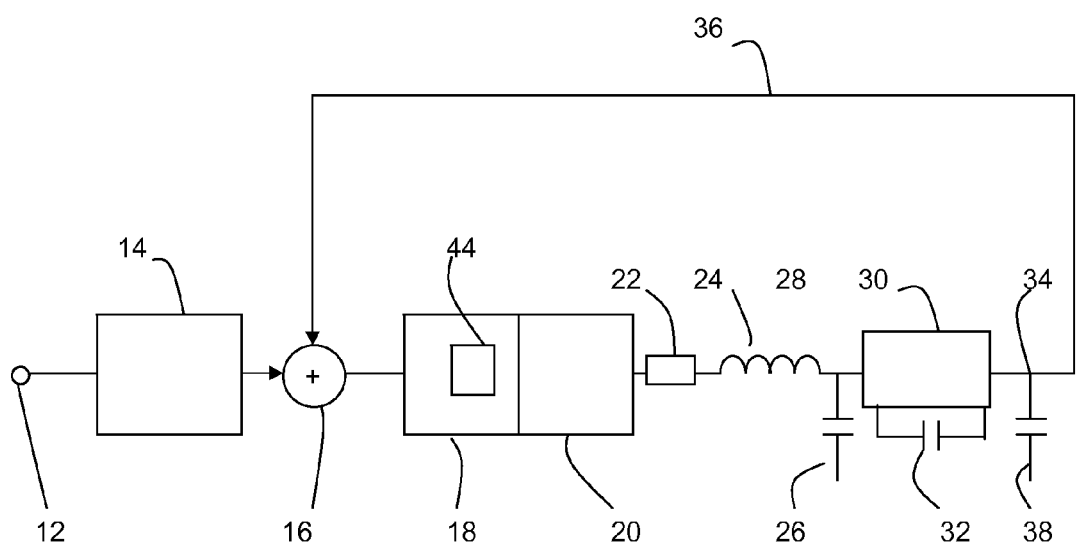
FIG. 2 shows a detail of the class H amplifier of FIG. 1.

Referring to FIG. 2, the voltage rail generation circuit 4 is shown in more detail.

A control input 12 accepts the input signal and passes the input signal to processor 14. This rectifies the input signal, adds the necessary headroom and processes the signal to limit the attack and decay times. The attack slope can be as high as possible since there is no need to limit the slope. The decay time does require limiting as will be described below.

The output of processor 14 is connected to adder 16 which is in turn connected to the input of the pulse width modulator (PWM) 18. This in turn drives Buck converter 20.

The output of the Buck converter 20 is fed through load resistor 22, inductor 24 and across positive smoothing capacitor 26, to generate a positive voltage on positive output node 28. This is connected to the input of charge pump 30 using charge pump capacitor 32. Although the drawing shows a single charge pump capacitor 32, this is schematic and in practice there may be more capacitors used.

The output of charge pump 30 is to negative output node 34 which is connected across negative smoothing capacitor 38. The voltage on this negative output node is then fed back through feedback path 36 to adder 16 to create a feedback loop. The output nodes 28,34 are connected to the respective voltage rails 6,8.

The inventors have realised that the use of this circuit automatically generates a low output impedance at the required times on the positive and negative output nodes 28,34.

Figure 3:
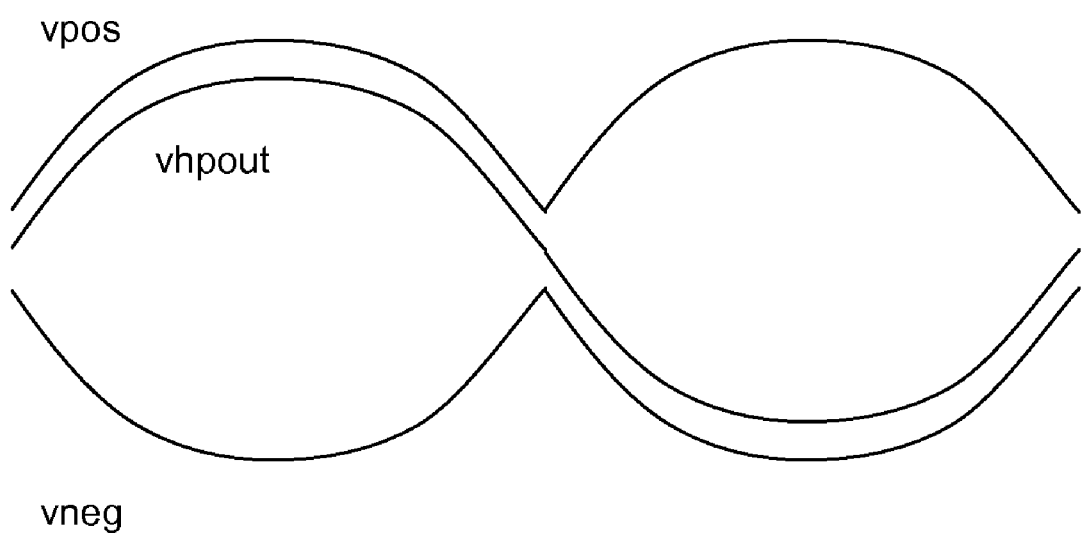
FIG. 3 shows a schematic drawing of the voltages used to drive a driver.

FIG. 3 illustrates the voltage on the voltage rails (vpos and vneg) as well as the voltage signal for amplification (vhpout). The difference is known as the headroom voltage. This is kept as constant and as low as possible consistent with correct operation—this results in a low power loss and high efficiency.

The charge pump 30 is an inverting charge pump connected to the positive supply.

In the embodiment shown, the charge pump is an uncontrolled charge pump, i.e. one without internal control to adjust the output voltage and hence ensure a low output impedance using a control loop. In such a circuit, assuming the resistance internally of the charge pump is Ron, the output impedance in the absence of such internal feedback would be 1/fc+8 Ron, where fc is the operation frequency, which is quite high. However, in the circuit according to this embodiment of the invention, the feedback by negative feedback path 36 acts to stabilise the voltage on node 34, and so reduce the effective output impedance. Thus, such a circuit is relatively simple.

In alternative embodiments, a controlled charge pump is used, in which the voltage at the output of the charge pump (node 34) is sensed and used to control the internal switches in the charge pump.

In this regard, it should be noted that the current to the output is supplied from the positive rail 6 when vhpout is positive and from the negative rail 8 when vhpout is negative. Thus, in the absence of feedback, only one of the positive and negative rails 6, 8 would suffer voltage reduction as a result of loading. The single feedback loop 36 is therefore effective, acting to control the voltage on positive output 28 when vhpout is positive and on negative output 34 when vhpout is negative without any need for additional control circuitry at all.

Figure 4:
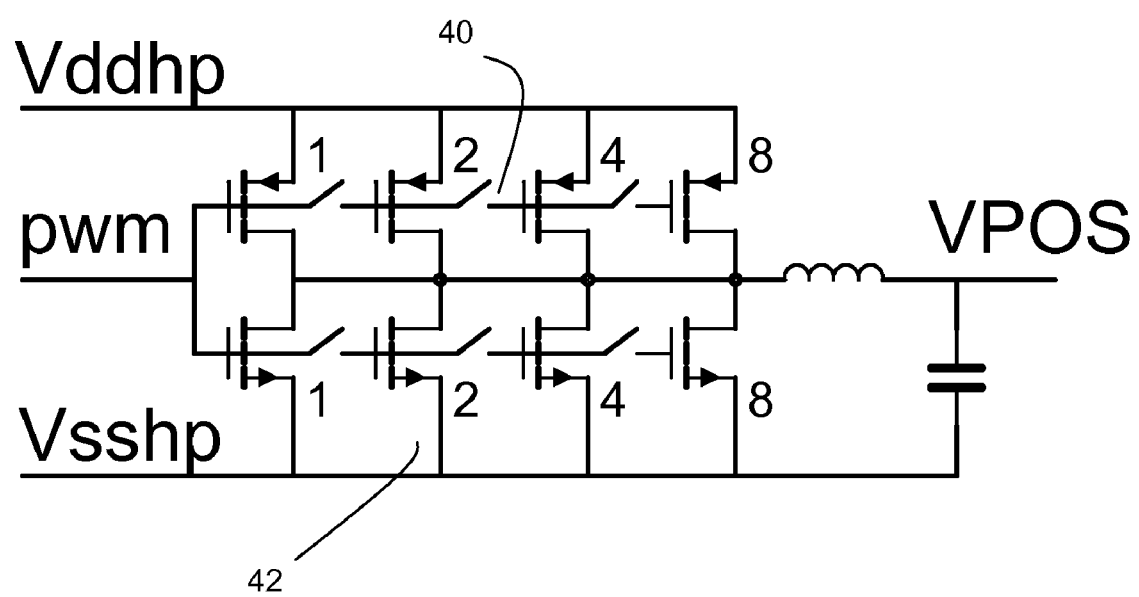
FIG. 4 shows a detail of the class H amplifier in an embodiment.

To further increase efficiency, a plurality of positive and a plurality of negative switches are used in both the Buck converter and the charge pump. FIG. 4 illustrates the output stage of the Buck converter—the output stage of the charge pump is essentially the same and omitted for clarity.

Four PMOS transistor switches 40 and four NMOS switches 42 are provided. These have different sizes, in the ratio 1:2:4:8. The Buck converter includes control circuit 44 in PWM 18 which controls which of the switches 40,42 are driven by the output of pulse width modulator 18. For low output currents, only the smallest transistor switches 40,42 are used (of relative size 1) whereas for the largest output currents all switches 40, 42 are used. For intermediate currents, the switches are closed to generate the correct output current.

The reason for using this technique is that it is necessary to have a fixed switching frequency to avoid interference with sensitive parts, and to ensure that the Buck converter is driven above the AM radio frequency band. If only a single, large switch was used this would result in a high switching loss. Since for low currents, only a small transistor area is used, the switching loss is greatly reduced, while using a fixed switching frequency.

The speed of the control loop needs to be limited, since higher signal frequencies will increase current through the positive smoothing capacitor 30 and the negative smoothing capacitor 38 which will increase losses. Calculation has shown that a suitable frequency is about 1 kHz, in general in the range 100 Hz to 10 kHz. At higher frequencies Vpos and Vneg may still be affected but only by the peaks of the input.

A further benefit of using the invention is that the output voltage can be double the dc voltage of the power supply. Assuming that the circuit is driven from a +3.3V supply and a 0V ground, an output signal of about 6V peak to peak can be generated since the charge pump can generate around −3V for Vneg and Vpos can be about +3V. The circuit accordingly has a booster action. This can make it particularly suitable in other applications.

The circuit may also be used to drive speakers, with a 4V rms signal across the speaker. This can achieve relatively high output power, with efficiency comparable to class D operation but with performance levels of class AB.

Figure 5:
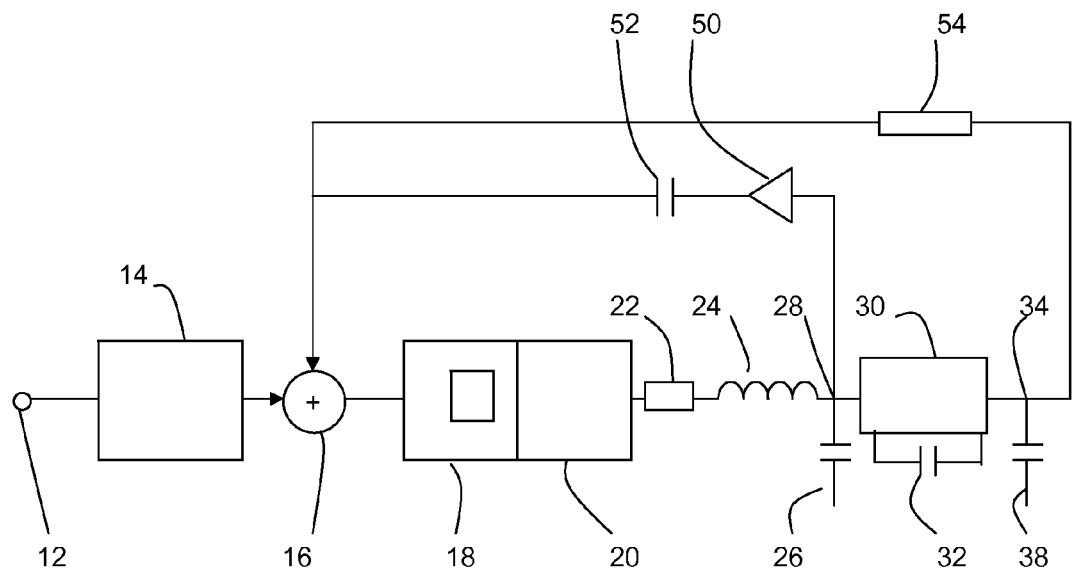
FIG. 5 shows a schematic diagram of a further embodiment of the invention.

FIG. 5 shows an alternative circuit, which does not just use negative feedback from negative node 34 but also, at high frequencies, from positive node 28. The negative feedback from positive node 28 is taken through inverter 50 and capacitor 52 and adds to the feedback on path 36 through resistor 54.

The reason for this is to increase the stability of the circuit. In essence, the combined effect of the resistance of the switches in the charge pump and the capacitor 38 at high frequencies is such that the transfer function of the circuit has three poles, and may not be stable. In the arrangement of FIG. 5, in contrast, at high frequencies, the dominant feedback path is from node 28 through inverter 50 and capacitor 52, omitting the charge pump 30 and capacitor 38 from consideration. Effectively, this adds a zero to the three poles which exist in the circuit of FIG. 2 and this is used to increase stability.

Figure 6:
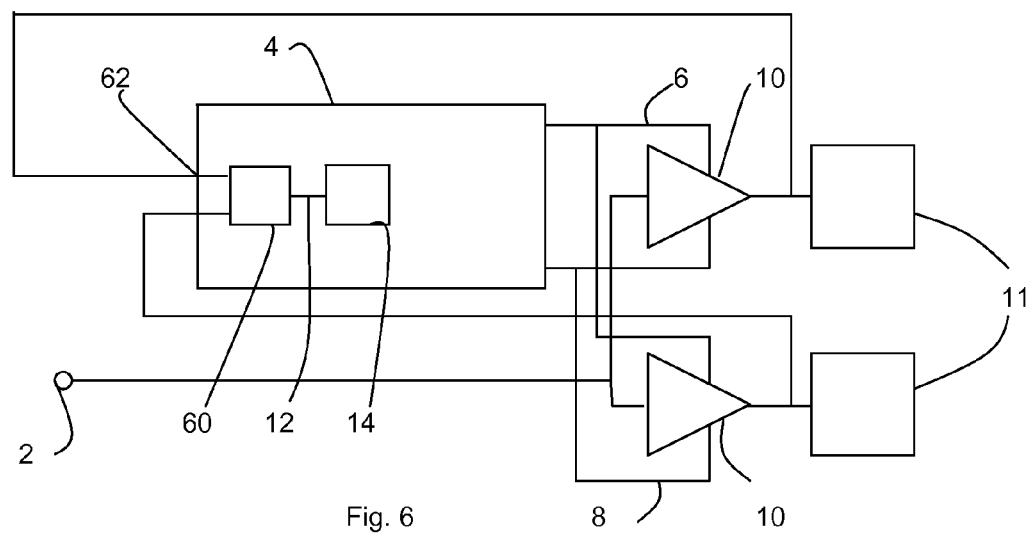
FIG. 6 shows a schematic diagram of a further embodiment.

FIG. 6 illustrates an alternative arrangement having two drivers 10, typically for driving a left stereo signal and a right stereo signal, sharing a single voltage generation circuit 4. In this case, the voltage generating circuit 4 has two combining inputs 62. The absolute maximum of the two combining inputs 62 is input to module 60 which outputs to the control input 12 connected to processor 14. Module 60 rectifies each of the input signals on the combining inputs 62, and connects the two rectified signals together such that the output is the maximum value of the two input signals. Further processing then takes place as described above. Those skilled in the art will be aware that modifications and changes can be made to the invention.

For example, the exact configuration of the circuit may vary, as may the exact properties of the Buck converter and charge pump circuits. Additional components may be added as required. Those skilled in the art will be familiar with Buck converter and charge pump circuits, and any suitable circuit may be used.

The sizes and nature of the switches embedded in the Buck converter and charge pump may be varied to cope with the required currents of the applications intended.

Although the circuit is described as being intended to drive headphones or a loudspeaker, it may be used to drive any suitable load.

The invention claimed is:

1. A class H amplifier circuit, comprising:
   a voltage rail generating circuit comprising:
   a control input;
   a pulse width modulator connected to the control input;
   a Buck converter connected to an output of the pulse width modulator for generating a voltage on a positive output node;
   an inverting charge pump connected to the positive output node for generating a negative voltage on a negative output node, the negative voltage being the negative of the voltage on the positive output node;
   a feedback path feeding back the voltage on the negative output node to sum with the signal on the control input to control the pulse width modulator, to provide a feedback loop including the Buck converter, inverting charge pump and pulse width modulator;
   the class H amplifier circuit further comprising an output driver driven by a positive voltage rail connected to the positive output node and a negative voltage rail connected to the negative output node.

2. An amplifier circuit according to claim 1, wherein the Buck converter includes a plurality of PMOS switches and a plurality of NMOS switches, the Buck converter being arranged to use switches of greater total area to drive higher currents and switches of lesser total area to drive lower currents.

3. An amplifier circuit according to claim 1, further comprising a feedback device to invert and feed back the voltage on the positive output node to control the pulse width modulator.

4. An amplifier circuit according to claim 1, wherein an output of the output driver is connected to the control input to control the voltage rail generating circuit.

5. An amplifier circuit according to claim 1, further comprising a processor between the control input and an adder, the adder having one input connected to an output of the processor and an other input connected to the negative output node via the feedback loop.

6. An amplifier circuit according to claim 5 wherein the processor is arranged to rectify the signal on the circuit input and to generate an output signal having a voltage difference to the rectified signal, the voltage difference being substantially constant over a cycle of an input signal.

7. An amplifier circuit according to claim 5, wherein the adder is connected to the negative output node by a resistor and to the positive output node through an inverter and a capacitor.

8. An amplifier according to claim 1, wherein the charge pump is a controlled charge pump which monitors the voltage at the output of the charge pump and controls the charge pump to stabilise the voltage.

9. An amplifier according to claim 1, wherein the charge pump is an uncontrolled charge pump which does not monitor the voltage at the output of the charge pump.

10. An amplifier according to claim 1, further comprising a single voltage rail generating circuit and two output drivers, each being connected to the voltage rails output by the voltage rail generating circuit;
    wherein the voltage rail generating circuit has two combining inputs, the control input of the voltage rail generating circuit receiving a signal that is based on a maximum absolute value of the voltage signal on the two combining inputs.

11. A headphone circuit comprising:
    an amplifier according to claim 10; and
    a pair of headphones, connected to the outputs of the two output drivers.

12. A headphone circuit comprising:
    two class H amplifier circuits according to claim 1; and
    a pair of headphones, connected to the outputs of the output drivers of the class H amplifier circuits.

13. A loudspeaker circuit comprising:
    a class H amplifier circuit according to claim 9; and
    a loudspeaker connected to the outputs of the output driver.

* * * * *